United States Patent
Kim et al.

(10) Patent No.: US 11,560,059 B2
(45) Date of Patent: Jan. 24, 2023

(54) APPARATUS FOR DEPLOYING A DISPLAY UNIT

(71) Applicants: HYUNDAI MOTOR COMPANY, Seoul (KR); KIA CORPORATION, Seoul (KR)

(72) Inventors: Hye Kyung Kim, Suwon-si (KR); Joo Hwa Kim, Hwaseong-si (KR); Il Chang Sung, Hwaseong-si (KR); Yoon Im, Suwon-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 0 days.

(21) Appl. No.: 17/512,362

(22) Filed: Oct. 27, 2021

(65) Prior Publication Data

US 2022/0212538 A1    Jul. 7, 2022

(30) Foreign Application Priority Data

Jan. 6, 2021  (KR) .......................... 10-2021-0001359

(51) Int. Cl.
*B60K 35/00* (2006.01)
*H05K 5/00* (2006.01)
*H05K 5/02* (2006.01)

(52) U.S. Cl.
CPC ........... *B60K 35/00* (2013.01); *H05K 5/0017* (2013.01); *H05K 5/0217* (2013.01); *B60K 2370/152* (2019.05); *B60K 2370/73* (2019.05)

(58) Field of Classification Search
None
See application file for complete search history.

(56) References Cited

U.S. PATENT DOCUMENTS

| | | | | |
|---|---|---|---|---|
| 7,735,432 | B2 * | 6/2010 | Jin ..................... | B60R 11/0235 248/188.4 |
| 7,869,129 | B2 * | 1/2011 | Lebreton ............ | G02B 27/0149 359/632 |
| 8,485,486 | B2 * | 7/2013 | Riedel ................. | B60R 11/0235 361/7 |
| 8,649,161 | B2 * | 2/2014 | Kato ................ | H04N 21/41422 345/905 |
| 8,991,951 | B2 * | 3/2015 | Lee ........................ | F16M 11/18 348/839 |
| 9,592,771 | B2 * | 3/2017 | Guering ................ | B64D 43/00 |
| 9,618,975 | B2 * | 4/2017 | Su ....................... | H04M 1/0266 |

(Continued)

FOREIGN PATENT DOCUMENTS

KR   101640053 B1   7/2016

*Primary Examiner* — Xanthia C Cunningham
(74) *Attorney, Agent, or Firm* — Lempia Summerfield Katz LLC

(57) ABSTRACT

An apparatus for deploying a display unit includes: a cowl cross bar disposed inside a crash pad; a housing disposed on the cowl cross bar and fastened to a center part of the crash pad; a display unit configured to be deployed along the housing; a rotating unit configured to rotate the housing with respect to the cowl cross bar; a driving unit coupled to the cowl cross bar in order to cause sliding movement of the cowl cross bar; and a controller configured to control at least one of the extent of deployment of the display unit, the amount of sliding movement of the cowl cross bar, or the amount of rotation of the housing.

12 Claims, 5 Drawing Sheets

(56) References Cited

U.S. PATENT DOCUMENTS

| | | | |
|---|---|---|---|
| 9,731,602 B2 | 8/2017 | Kim et al. | |
| 9,989,761 B2* | 6/2018 | Yomogita | F16H 19/001 |
| 10,416,459 B2* | 9/2019 | Tatekawa | G02B 27/0149 |
| 10,451,873 B2* | 10/2019 | Park | B60K 37/04 |
| 10,656,419 B2* | 5/2020 | Han | B60K 35/00 |
| 10,663,726 B2* | 5/2020 | Shin | B60R 11/02 |
| 10,671,179 B2* | 6/2020 | Xia | G06F 3/03547 |
| 11,166,388 B2* | 11/2021 | Diboine | G09F 9/301 |
| 11,178,782 B2* | 11/2021 | Song | H05K 5/0217 |
| 11,224,136 B2* | 1/2022 | Song | B60K 35/00 |
| 11,259,420 B1* | 2/2022 | Copeland | H05K 5/0217 |
| 2014/0085787 A1* | 3/2014 | Kato | B60R 11/0235 |
| | | | 361/679.01 |
| 2016/0193924 A1 | 7/2016 | Kim et al. | |
| 2018/0364479 A1* | 12/2018 | Kwak | G02B 27/0149 |
| 2020/0189661 A1* | 6/2020 | Kong | B62D 25/145 |
| 2021/0206265 A1* | 7/2021 | Song | B60K 35/00 |

* cited by examiner

APPARATUS FOR DEPLOYING A DISPLAY UNIT

CROSS-REFERENCE TO RELATED APPLICATION

This application claims under 35 U.S.C. § 119(a) the benefit of priority to Korean Patent Application No. 10-2021-0001359 filed on Jan. 6, 2021, the entire contents of which are incorporated herein by reference.

BACKGROUND

(a) Technical Field

The present disclosure relates to an apparatus for deploying a display unit. More particularly, the present disclosure relates to an apparatus for deploying a display unit located inside a crash pad and for controlling tilting of the display unit in a forward-backward direction considering the traveling state or the state of a seat of a vehicle.

(b) Background Art

In general, a vehicle is provided with a display apparatus near the driver's seat thereof for providing a variety of pieces of information. The display apparatus may provide various information, such as information about a route from a point of departure to a destination and information about the current location of the vehicle.

In addition, the display apparatus may reproduce music or video, may receive terrestrial broadcasting signals or satellite broadcasting signals and display the same on a screen, and may provide information about the state of the vehicle or information for user convenience, such as weather and news.

A conventional vehicular display apparatus is configured such that a display unit thereof is deployed in a manner of being moved in a vertical direction using a lead screw from a state of being accommodated in a housing. However, because the speed at which the display unit is moved is determined by the pitch of the lead screw and the speed of a motor, there is a problem in that the driving speed is low and tilting of the display unit is impossible.

The above information disclosed in this Background section is only to enhance understanding of the background of this disclosure. Therefore, the Background section may contain information that does not form the related art that is already known in this country to a person of ordinary skill in the art.

SUMMARY

Therefore, there is a need to solve the above noted low speed and display unit tilt problems. Further, there is a need to develop a display unit capable of being actively controlled in response to a change in the driving environment or a change in the state of a seat. Furthermore, there is a need to develop technology for controlling tilting of a display unit and the distance between a user and a display unit in response to the external environment of a vehicle.

The present disclosure has been made in an effort to solve the above-described problems associated with the related art. It is an object of the present disclosure to provide an apparatus for deploying a display unit so that the angle of the display unit is controlled in consideration of the traveling state or the state of a seat of a vehicle.

It is another object of the present disclosure to provide an apparatus for deploying a display unit in a manner in which a cowl cross bar performs sliding movement, thereby changing the position of the display unit in consideration of the traveling state of a vehicle.

The objects of the present disclosure are not limited to the above-mentioned objects. Other objects not mentioned herein should be clearly understood by those having ordinary skill in the art from the following description and should become apparent with reference to the embodiments of the present disclosure. In addition, the objects of the present disclosure can be accomplished by the components described in the appended claims and combinations thereof.

In one aspect, the present disclosure provides an apparatus for deploying a display unit. The apparatus includes: a cowl cross bar disposed inside a crash pad; a housing disposed on the cowl cross bar and fastened to a center part of the crash pad; a display unit configured to be deployed along the housing; a rotating unit configured to rotate the housing with respect to the cowl cross bar; a driving unit coupled to the cowl cross bar in order to cause sliding movement of the cowl cross bar; and a controller configured to control at least one of the extent of deployment of the display unit, the amount of sliding movement of the cowl cross bar, or the amount of rotation of the housing.

In an embodiment, the driving unit may include a rack gear part, engaged with a side bracket fixed to the vehicle body. The driving unit may also include a driving part, disposed at the side bracket to apply driving force to the rack gear part so that the rack gear part moves along a guide part, provided at the side bracket, in the longitudinal direction of the guide part.

In another embodiment, the rotating unit may include a gear part, disposed around the outer surface of the cowl cross bar that faces the housing. The rotating unit may also include a rotating part, disposed at the housing to apply rotational force to the housing so that the housing is rotated along the gear part.

In still another embodiment, the apparatus may further include a link part disposed at a portion of the cowl cross bar to which the housing is fastened.

In yet another embodiment, the controller may control the extent of deployment of the display unit depending on the driving mode of the vehicle.

In still yet another embodiment, the controller may control the tilting angle of the display unit depending on the driving mode of the vehicle.

In another embodiment, the controller may control sliding movement of the center part depending on the driving mode of the vehicle.

In another embodiment, when a seatback is reclined to a predetermined angle or more, the controller may perform control such that the housing is rotated.

In still another embodiment, when a seat is rotated in a leftward-rightward direction to an angle greater than a predetermined angle, the controller may perform control such that the display unit is fully deployed from the housing and stands upright.

In yet another embodiment, the controller may control the tilting angle of the housing depending on the state of light introduced into the vehicle from an external light source present outside the vehicle.

Other aspects and embodiments of the disclosure are discussed hereinbelow.

It is understood that the terms "vehicle" or "vehicular" or other similar terms as used herein are inclusive of motor vehicles in general. Such motor vehicles include: passenger automobiles including sports utility vehicles (SUV), buses, trucks, and various commercial vehicles; watercraft including a variety of boats and ships; aircraft; and the like. Such motor vehicles also include hybrid vehicles, electric vehicles, plug-in hybrid electric vehicles, hydrogen-powered vehicles, and other alternative fuel vehicles (e.g. fuels derived from resources other than petroleum). As referred to herein, a hybrid vehicle is a vehicle that has two or more sources of power, for example, vehicles that are both gasoline-powered and electric-powered.

The above and other features of the disclosure are discussed hereinbelow.

BRIEF DESCRIPTION OF THE DRAWINGS

The above and other features of the present disclosure are described in detail with reference to several embodiments thereof, illustrated in the accompanying drawings, which are given hereinbelow by way of illustration only, and thus are not limitative of the present disclosure, and wherein.

Figure 1:
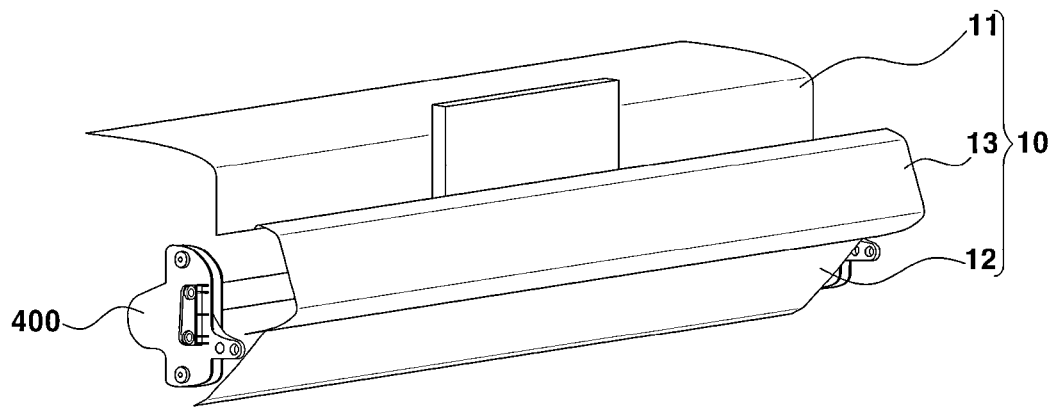
FIG. 1 is a perspective view of an apparatus for deploying a display unit according to an embodiment of the present disclosure.

It should be understood that the appended drawings are not necessarily to scale, presenting a somewhat simplified representation of various features illustrative of the basic principles of the disclosure. The specific design features of the present disclosure as disclosed herein, including, for example, specific dimensions, orientations, locations, and shapes, will be determined in part by the particular intended application and use environment.

In the figures, reference numbers refer to the same or equivalent parts of the present disclosure throughout the several figures of the drawings.

DETAILED DESCRIPTION

Hereinafter, embodiments of the present disclosure are described in detail with reference to the accompanying drawings. The present disclosure may, however, be embodied in many different forms, and should not be construed as being limited to the embodiments set forth herein. Rather, these embodiments are provided so that the disclosure is thorough and complete, and fully conveys the scope of the disclosure to those having ordinary skill in the art.

The terms "- part", "- unit", and "- system" used in the specification mean units for processing at least one function or operation, and can be implemented as hardware components, software components, or combinations of hardware components and software components.

Further, in the following description, the terms "first" and "second" are used only to avoid confusing designated components, and do not indicate the sequence or importance of the components or the relationships between the components.

Further, in the following description, the term "forward direction" refers to a horizontal direction, corresponding to the direction in which a vehicle travels. The term "backward direction" refers to a direction opposite the forward direction.

Further, in the following description, a vehicle is described as capable of being driven in a manual driving mode and an autonomous driving mode. The manual driving mode refers to a mode in which a vehicle is manually driven by a driver. The autonomous driving mode refers to a mode in which a vehicle autonomously travels using, for example, an advanced driver assistance system (ADAS), without the intervention of a driver.

Further, tilting of a seat 20 refers to movement of a seatback 21 to a certain angle in the forward-backward direction of a vehicle. Swiveling of the seat 20 refers to movement of the seat 20 to a certain angle in the width direction of the vehicle.

Hereinafter, an embodiment is described in detail with reference to the accompanying drawings. The same or similar components are denoted by the same reference numerals throughout the specification, and a duplicate description thereof has been omitted.

The present disclosure relates to an apparatus for deploying a display unit 100. Specifically, the present disclosure relates to an apparatus for deploying a display unit 100 including a rollable display that is capable of being wound into and unwound out of a crash pad 10 provided in the occupant compartment of a vehicle.

The display unit 100 may be wound into a housing 200 by a winding unit located inside the housing 200. The display unit 100 may be configured as a flexible display.

Further, the present disclosure provides an apparatus for deploying a display unit 100, in which a center part 13 is driven so as to change the extent of deployment of the display unit 100, the angle formed by the display unit 100 and the crash pad 10, and the distance between the display unit 100 and a user sitting in a seat of a vehicle.

In addition, a rotating unit for rotating the housing 200 is included in order to tilt the display unit 100. Thus, the display unit 100 is capable of being rotated in the forward-backward direction.

FIG. 1 is a perspective view of a crash pad 10 at which an apparatus for deploying a display unit 100 according to an embodiment of the present disclosure is located.

As shown, the crash pad 10 includes an upper part 11, a lower part 12, and a center part 13, which is located between the upper part 11 and the lower part 12 in a height direction. The crash pad 10 further includes a housing 200, which accommodates the display unit 100 configured to protrude upwards from the center part 13. The crash pad 10 also includes a cowl cross bar 300, which is located inside the center part 13 so as to extend in the width direction of the vehicle and to be coupled at both ends thereof to side brackets 400.

The housing 200 is located on the cowl cross bar 300. A link part 320 is provided between the housing 200 and the cowl cross bar 300 so that the housing 200 is rotated in the forward-backward direction with respect to the cowl cross bar 300. When the rotational force of the rotating unit is transmitted thereto, the link part 320 enables the housing 200 to be moved independently of the cowl cross bar 300. The housing 200 may be configured to be rotated in the forward-backward direction with respect to the cowl cross bar 300.

The cowl cross bar 300 may include an outer surface having a flat portion so that the link part 320 is engaged therewith. The link part 320 may be fixed to the cowl cross bar 300. The housing 200 is located on the outer surface of the link part 320 and is configured to be rotated along the outer surface of the link part 320 about the center axis of the cowl cross bar 300.

The center part 13 is configured to pop up into the occupant compartment of the vehicle. The cowl cross bar 300, which is coupled to the inner side of the center part 13, is moved along a guide part 420 located at each of the side brackets 400, so the center part 13 fixed to the cowl cross bar 300 is moved in the longitudinal direction of the guide part 420. The guide part 420 may be formed so as to be oriented in the longitudinal direction of the vehicle. The guide part 420 may be formed so as to be oriented at a predetermined angle in the height direction with respect to the horizontal plane of the vehicle body.

The center part 13 is integrally moved with the cowl cross bar 300 in the longitudinal direction of the guide part 420 by a controller 500. When a user request or a signal for switching to the autonomous driving mode is received, the controller 500 performs control such that the center part 13 is moved to be inserted into the space between the upper part 11 and the lower part 12.

The center part 13 may protrude out of the crash pad 10 from a fully pulled-down position to a fully popped-up position. The center part 13 may be located at a certain position between the fully pulled-down position and the fully popped-up position. When a signal for switching to the autonomous driving mode is received or when a user request is received in the manual driving mode, the controller 500 may perform control such that the center part 13 is moved to a certain position between the fully pulled-down position and the fully popped-up position.

According to an embodiment of the present disclosure, when the driving mode received by the controller 500 is the manual driving mode, the center part 13 is fully popped up. When the driving mode received by the controller 500 is the autonomous driving mode, the center part 13 is pulled down into the crash pad 10 and stops at a position at which the display is capable of being fully deployed.

Further, when the user inputs a command for turning off the display unit 100 in the autonomous driving mode, the controller 500 performs control such that the display unit 100 is wound into the housing 200 and the center part 13 is moved into the crash pad 10 and stops at the fully pulled-down position.

The controller 500 is configured to independently or simultaneously control the extent of deployment of the display unit 100 and the tilting angle of the display unit 100 depending on the driving mode of the vehicle. According to an embodiment, when the driving mode of the vehicle is the manual driving mode, the controller 500 may deploy the display unit 100 to a height lower than the maximum height to which the display unit 100 is fully deployed and may tilt the display unit 100 to a predetermined angle in the forward direction of the vehicle.

Conversely, when the driving mode of the vehicle is the autonomous driving mode, the controller 500 may fully deploy the display unit 100 and may tilt the display unit 100 in the backward direction of the vehicle. Further, in the autonomous driving mode, the controller 500 may perform control such that at least a portion of the center part 15 is inserted into the space between the upper part 11 and the lower part 12.

The controller 500 may set the extent of deployment and tilting angle of the display unit 100 depending on the driving mode of the vehicle, the reclining angle of the seatback 21, and the swiveling angle of the seat 20.

In addition, the controller 500 may receive information about an external light source from a vision sensor, which is located inside or outside the occupant compartment of the vehicle. The controller 500 may measure the angle at which the light emitted from the external light source is introduced into the occupant compartment of the vehicle. Further, the controller 500 may deploy or tilt the display unit 100 based on the information about the external light source transmitted from the vision sensor. In the manual driving mode of the vehicle, the controller 500 may measure the quantity of external light introduced into the occupant compartment and the angle of incidence of external light using the vision sensor and may perform control such that the display unit 100 is tilted 5 to 10 degrees in the forward direction.

As described above, the controller 500 may control at least one of the extent of deployment of the display unit 100, the tilting angle of the display unit 100, or the position of the center part 13 depending on at least one of the driving mode of the vehicle, the reclining angle of the seatback 21, or the swiveling angle of the seat 20.

Figure 2A:
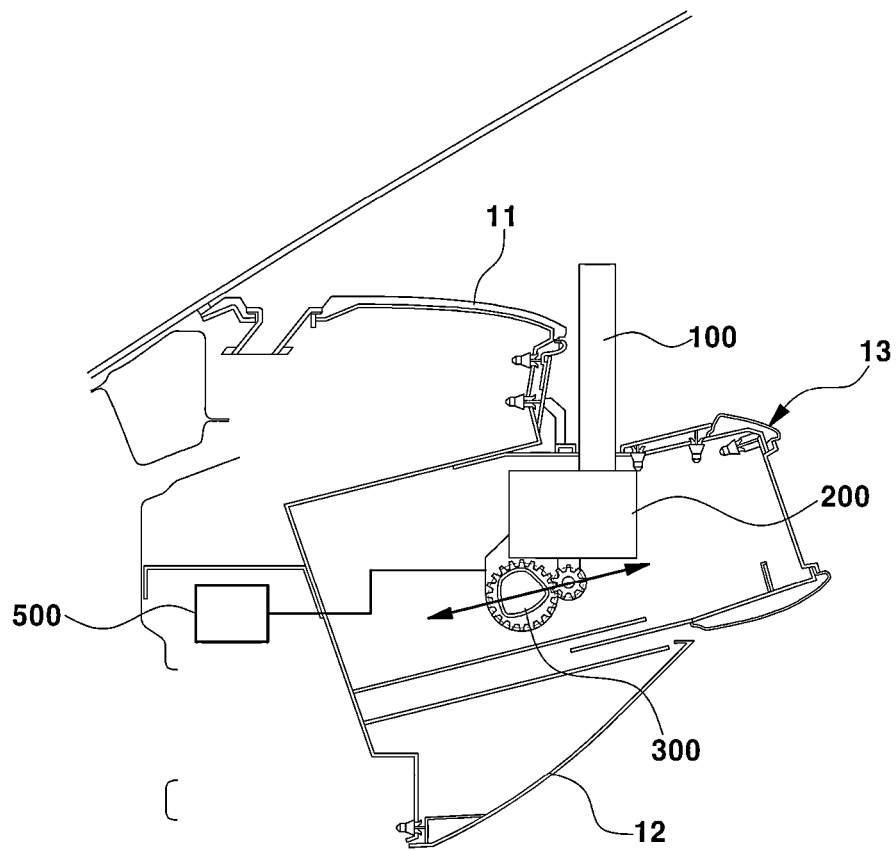
FIG. 2a is a side cross-sectional view showing the popped-up state of the apparatus for deploying a display unit according to an embodiment of the present disclosure.
Figure 2B:
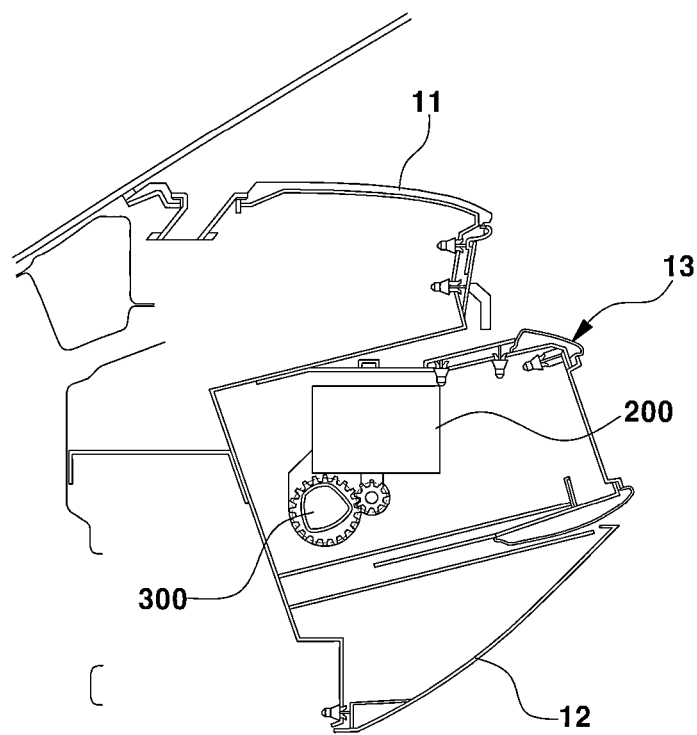
FIG. 2b is a side cross-sectional view showing the pulled-down state of the apparatus for deploying a display unit according to an embodiment of the present disclosure.

FIG. 2a is a cross-sectional view showing the state in which the cowl cross bar 300 slides along the guide part 420 in the backward direction of the vehicle and the center part 13 is fully popped up. FIG. 2b is a cross-sectional view showing the state in which the cowl cross bar 300 slides along the guide part 420 in the forward direction of the vehicle and the center part 13 is fully pulled down.

In other words, the center part 13 may be moved between the fully pulled-down position and the fully popped-up position according to the movement of the cowl cross bar 300 along the guide part 420 located at each of the side brackets 400 mounted to the vehicle body.

According to an embodiment of the present disclosure, when the display unit 100 is fully deployed, the controller 500 may perform control such that the housing 200 is tilted to a predetermined angle in the backward direction of the vehicle and at least a portion of the center part 13 is inserted into the crash pad 10. Further, when a signal for switching to the manual driving mode or a user request is received, the controller 500 controls a driving unit 310 to fully pop up the center part 13.

According to another embodiment of the present disclosure, the controller 500 is configured to independently set the extent of deployment of the display unit 100 and the tilting angle of the display unit 100 depending on the state of the center part 13.

Figure 3:
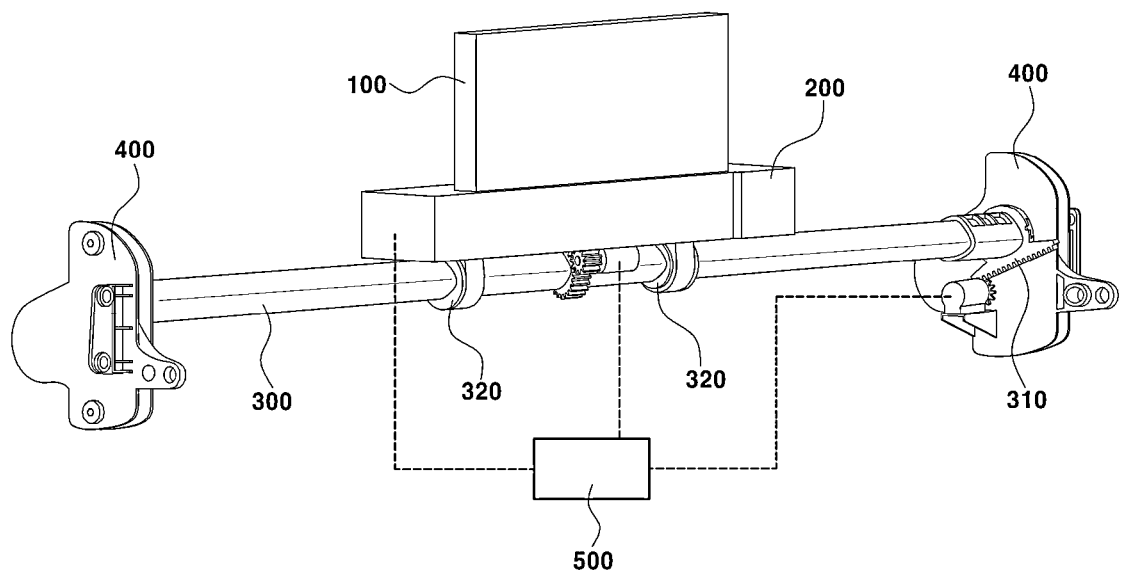
FIG. 3 is a view showing the engagement relationship between a cowl cross bar and a housing according to an embodiment of the present disclosure.

FIG. 3 shows the housing 200, located on the cowl cross bar 300, and the side brackets 400, coupled to the two ends of the cowl cross bar 300 according to an embodiment of the present disclosure.

The housing 200 is located on the middle portion of the cowl cross bar 300 and surrounds the outer surface of the cowl cross bar 300. The housing 200 may be configured to be coupled to the outer surface of the link part 320, which is located on the outer surface of the cowl cross bar 300. The housing 200 is rotated along the link part 320 about the center of the cowl cross bar 300 in the longitudinal direction. When the housing 200 is rotated, the display unit 100, which is deployed upwards from the housing 200, is integrally rotated with the housing 200.

The two ends of the cowl cross bar 300 are coupled to the side brackets 400 fixed to the vehicle body. Driving units 310 are provided between the two ends of the cowl cross bar 300 and the side brackets 400. Each of the driving units 310 may surround at least a portion of the cowl cross bar 300.

The driving unit 310 is formed such that one surface thereof surrounds at least a portion of the end of the cowl cross bar 300 and the opposite surface thereof faces the side bracket 400. The side bracket 400 is provided with a guide part 420, to which at least a portion of the driving unit 310 is coupled. The guide part 420 may include an elevated flat surface, and the driving unit 310 may be inserted into the space between the upper surface of the side bracket 400 and the elevated flat surface of the guide part 420.

The driving unit 310 includes a rack gear part 311 formed to be substantially parallel to the guide part 420. The driving unit 310 receives the driving force of a driving part 410, which is provided at the side bracket 400, so as to move the cowl cross bar 300 in the longitudinal direction of the guide part 420.

The controller 500 controls the driving force of the driving part 410 so as to control the movement of the rack gear part 311 in the longitudinal direction. The rack gear 311 is integrally formed with the driving unit 310. The extent to which the center part 13 protrudes upwards from the crash pad 10 is set by varying the extent to which the driving part 410 is driven.

Figure 4:
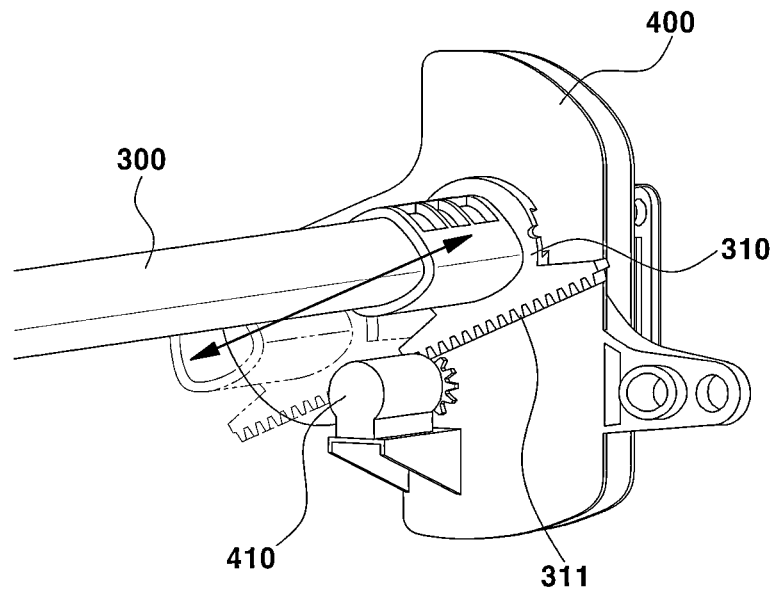
FIG. 4 is a view showing the engagement relationship between the cowl cross bar and a side bracket according to an embodiment of the present disclosure.
Figure 5:
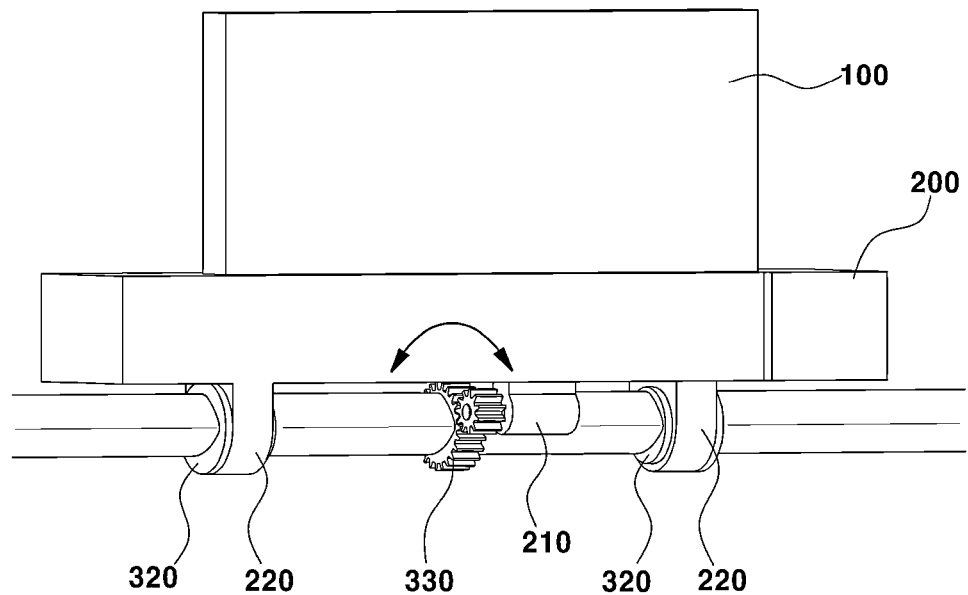
FIG. 5 is a view showing the configurations of the cowl cross bar and the side bracket according to an embodiment of the present disclosure.

FIG. 4 shows the driving unit 310 and the cowl cross bar 300, which are coupled to the side bracket 400. FIG. 5 shows the configurations of the side bracket 400, the cowl cross bar 300, and the driving unit 310.

The rack gear part 311 is tooth-engaged with the driving part 410 fixed to the side bracket 400 so as to be moved by the driving force of the driving part 410. Further, at least a portion of the driving unit 310 is inserted into the side bracket 400, which includes the guide part 420, so that the driving unit 310 is capable of being moved in the longitudinal direction of the guide part 420.

The driving unit 310 may include a slot portion 312 formed therein to allow the elevated flat surface of the guide part 420 to be inserted thereinto. When the rotational force of the driving part 410 is applied to the driving unit 310, the slot portion 312 is moved along the guide part 420. Accordingly, the cowl cross bar 300 is integrally moved with the driving unit 310 in the longitudinal direction of the guide part 420.

The guide part 420 may be formed so as to be oriented in the longitudinal direction of the vehicle. The guide part 420 may be formed so as to be oriented at a predetermined angle with respect to the longitudinal direction of the vehicle. The shape of the guide part 420 may be set depending on the position at which the center part 13 is popped up and the height to which the center part 13 is popped up. The rack gear part 311 is moved along the guide part 420. Accordingly, the cowl cross bar 300, to which the driving unit 310 including the rack gear part 311 is coupled, is integrally moved with the center part 13 according to the movement of the rack gear part 311 in the longitudinal direction of the guide part 420.

In the state in which the front end of the rack gear part 311 is engaged with the driving part 410, the center part 13 is maintained in the state of being fully popped up into the occupant compartment of the vehicle. In the state in which the rear end of the rack gear part 311 is engaged with the driving part 410, the center part 13 is maintained in the state of being fully pulled down into the crash pad 10.

In this way, the extent to which the center part 13 protrudes from the front surface of the crash pad 10 is determined by the extent to which the driving part 410 is driven and the engagement position between the rack gear part 311 and the driving part 410.

Figure 6:
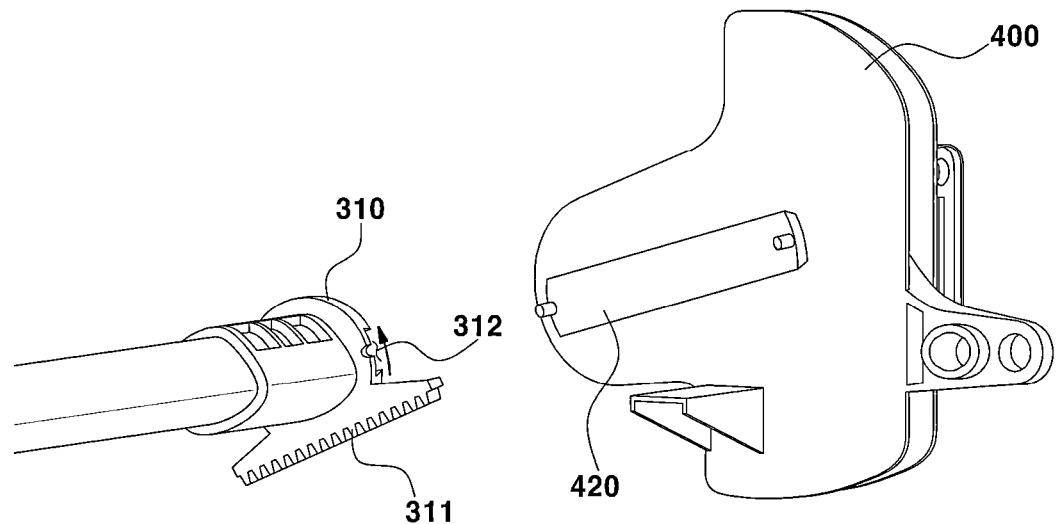
FIG. 6 is an enlarged view of the housing fastened to the cowl cross bar according to an embodiment of the present disclosure.

FIG. 6 shows the configuration of the rotating unit, which is configured to rotate the housing 200, coupled to the cowl cross bar 300, in the forward-backward direction of the vehicle.

The housing 200 is coupled to at least a portion of the cowl cross bar 300. The housing 200 includes therein a winding part (not shown) for winding the rollable display. The housing 200 includes an opening formed in the upper end thereof to deploy the display unit 100 therethrough and includes a fastening part 220 formed at the lower end thereof to be fastened to the cowl cross bar 300. The fastening part 220 is formed so as to surround the link part 320 located on the outer surface of the cowl cross bar 300 and to be rotatable relative to the link part 320.

A gear part 330 may be fixedly provided around the outer surface of the cowl cross bar 300 at a position adjacent to the link part 320. The housing 200 includes a rotating part 210 provided on the lower surface thereof at a position adjacent to the cowl cross bar 300 so as to be engaged with the gear part 330.

According to an embodiment of the present disclosure, the rotating part 210 may be implemented as a motor, and a gear may be connected to the rotating shaft of the motor. The gear connected to the rotating shaft of the motor meshes with the gear part 330 fixed to the cowl cross bar 300. Thus, the housing 200 is capable of being rotated about the center axis of the cowl cross bar 300 in the forward-backward direction of the vehicle.

The link part 320 is coupled to the cowl cross bar 300. The fastening part 220 of the housing 200 is disposed so as to surround the outer surface of the link part 320 and to be rotatable relative to the link part 320. Accordingly, when the driving force of the motor disposed on the lower surface of the housing 200 is applied to the gear part 330, the housing 200 is rotated along the link part 320.

According to an embodiment of the present disclosure, the housing 200 may be rotated 5 degrees in the forward direction of the vehicle and 15 degrees in the backward direction of the vehicle. The housing 200 may be rotated freely within a region in which the upper part 11 of the crash pad 10 and the display unit 100 do not interfere with each other. Further, the extent to which the housing 200 is rotated may be automatically controlled by the controller 500 depending on the reclining angle of the seat 20, the rotating angle (swiveling angle) of the seat 20 in the leftward-rightward direction, and the traveling state of the vehicle.

The controller 500 receives information about the reclining angle of the seat 20 and controls the rotating part 210 based on the received information about the reclining angle of the seat 20 such that the housing 200 is rotated corresponding to the angle of the seatback 21 of the seat 20. Further, the controller 500 receives information about the swiveling angle of the seat 20 and controls the rotating part 210 of the housing 200 such that the display unit 100 is oriented vertically in the height direction of the vehicle.

Furthermore, when the center part 13 is moved to a position adjacent to the fully pulled-down position by the sliding movement of the cowl cross bar 300 along the guide part 420, the controller 500 rotates the housing 200 to a predetermined angle so that the display unit 100 does not interfere with the upper part 11 of the crash pad 10.

Figure 7A:
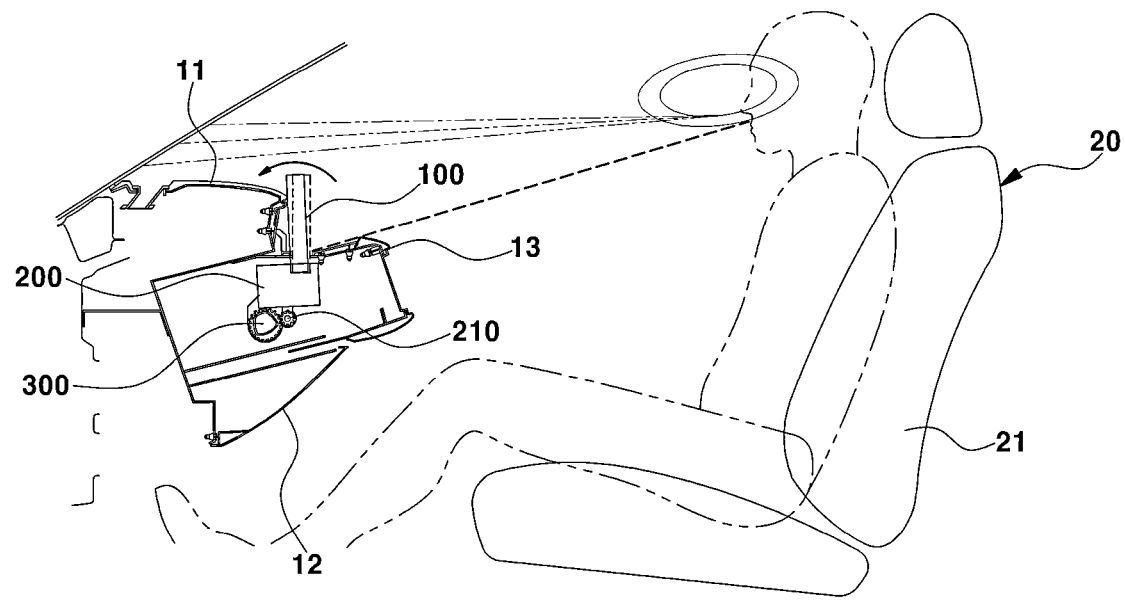
FIG. 7a is a view showing the deployed state of the display unit in a manual driving mode according to an embodiment of the present disclosure.

FIG. 7a shows the tilting angle of the display unit 100 in the manual driving mode of the vehicle.

In the manual driving mode, the display unit 100 needs to be tilted to a predetermined angle in the forward direction of the vehicle in order to secure the user's view. To this end, the controller 500 rotates the housing 200 such that the display unit 100 is tilted 5 degrees in the forward direction of the vehicle.

In other words, when the driving mode of the vehicle is switched to the manual driving mode, the controller 500 tilts the display unit 100 in the forward direction of the vehicle so that the display unit 100, deploying upwards from the housing 200, does not obstruct the user's view. Accordingly, the display unit 100 is located in the state of being tilted to a predetermined angle below the user's field of vision in front of the vehicle.

Figure 7B:
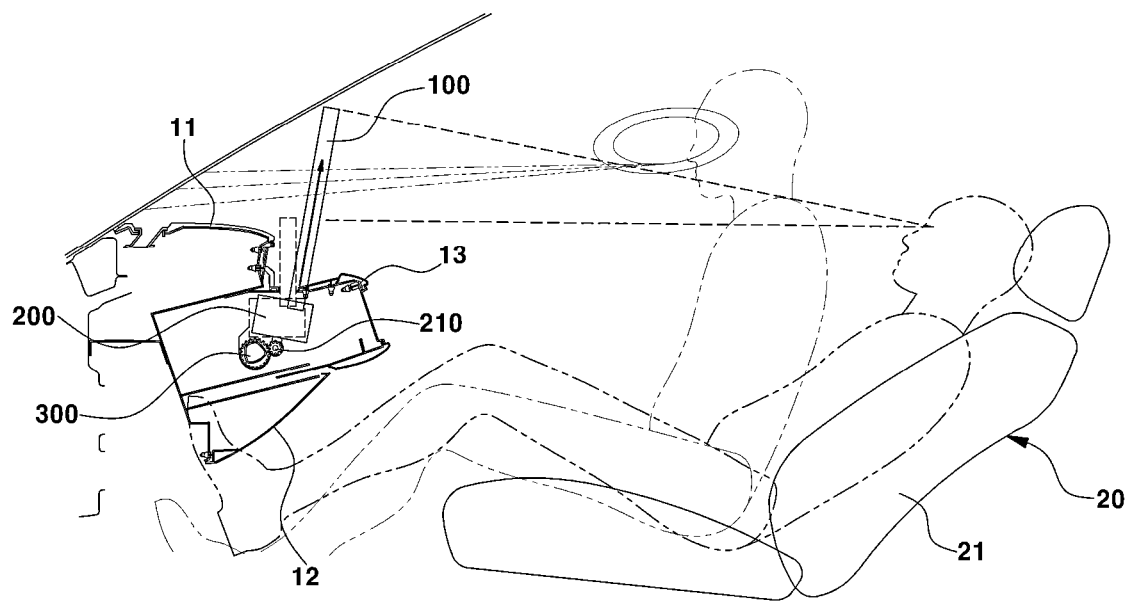
FIG. 7b is a view showing the deployed state of the display unit in an autonomous driving mode according to an embodiment of the present invention.

FIG. 7b shows the tilting angle of the display unit 100 when the vehicle is driven in the autonomous driving mode or when the reclining angle of the seat 20 exceeds a reference angle set by the controller 500.

As shown, when a signal for switching to the autonomous driving mode is received or when the reclining angle of the seat 20 exceeds a set reference angle, the controller 500 performs control such that the display unit 100 is tilted to the maximum extent in the backward direction of the vehicle so as to substantially correspond to the reclining angle of the seatback 21. In other words, when the vehicle is driven in the autonomous driving mode or when the seat 20 is reclined backwards to an angle exceeding a reference angle set by the controller 500, the controller 500 controls the rotating part 210 to tilt the housing 200 to the maximum extent in the backward direction of the vehicle such that the front surface of the display unit 100 is oriented obliquely downwards. Accordingly, the position of the display unit 100 is changed so that the front surface thereof comes within the user's field of vision.

When the reclining angle of the seat 20 exceeds a set reference angle (a relaxation mode) in the autonomous driving mode of the vehicle, the controller 500 may perform control such that the display unit 100 is fully deployed and may control the driving part 410 such that the center part 13 is fully pulled down.

In this way, in the relaxation mode, the controller 500 controls the extent of deployment and the tilting angle of the display unit 100 so as to increase the driver's convenience and controls the driving part 410 such that the center part 13 is fully pulled down, thereby increasing the amount of indoor space in the vehicle.

Figure 7C:
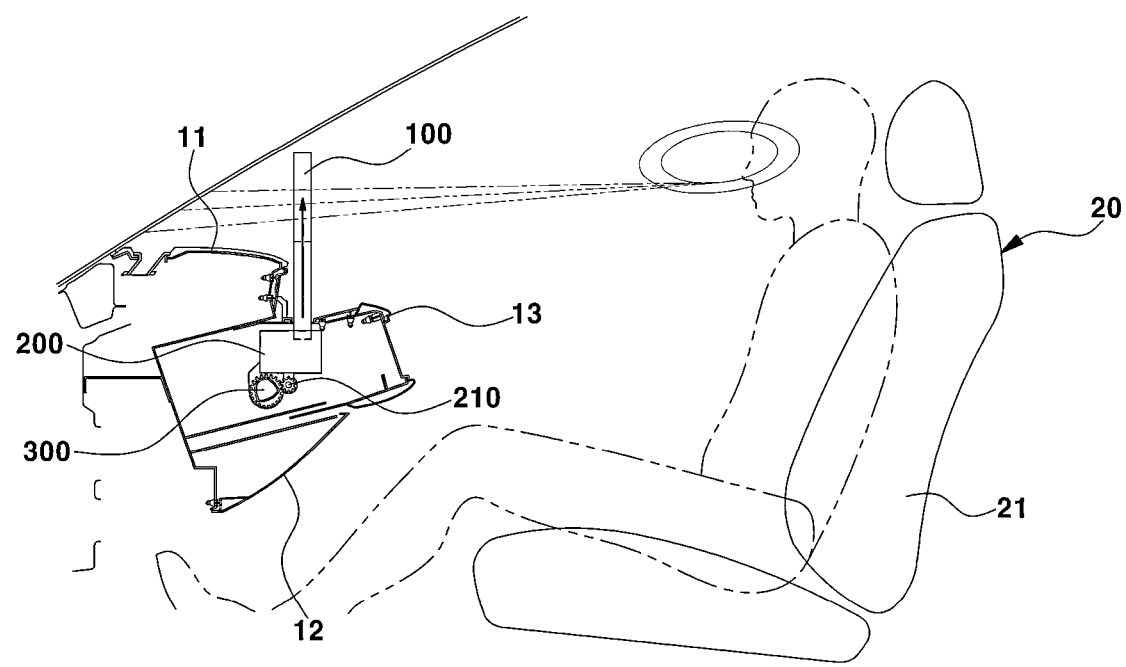
FIG. 7c is a view showing the deployed state of the display unit upon swiveling of a seat according to an embodiment of the present disclosure.

FIG. 7c is a side view showing the angle to which the display unit 100 is deployed in a swiveled state of the seat 20.

When the seat 20 is swiveled, i.e., rotated in the leftward-rightward direction so that the driver is capable of viewing the passenger sitting in the front-row seat, the controller 500 determines that the seat 20 is in a swiveled state and performs control such that the display unit 100 is fully deployed vertically in the height direction of the vehicle.

This state may be used as a conversation mode enabling conversation between the occupants sitting in the front-row seats. At this time, the display unit 100 is fully deployed so that the occupants are capable of sharing the screen of the display unit 100. In other words, the display unit 100 and the center part 13 are controlled such that the display unit 100 is fully deployed vertically in the height direction of the vehicle so as to enable the occupants sitting in the front-row seats and the back-row seats to share an image displayed on the display unit 100.

In an embodiment of the present disclosure, when the seat 20 is rotated in the leftward-rightward direction to an angle greater than a first set angle, the controller performs control such that the display unit 100 is fully deployed from the housing and stands upright in the height direction of the vehicle.

Conversely, when the seat 20 is rotated in the leftward-rightward direction to an angle less than or equal to the first set angle, the controller performs control such that the display unit 100 is drawn into the housing and the center part is inserted into the crash pad. As an example of the present disclosure, the first set angle may be set to a rotation angle of 90 degrees to the left and the right with respect to the center portion of the seat. The first set angle may be set differently depending on the angle to which the seat can be swiveled.

As should be apparent from the above description, the present disclosure provides the following effects through the above embodiments and through the configurations and combination and use relationships described above.

The apparatus for deploying a display unit according to the present disclosure controls the tilting angle of the display unit depending on the traveling state of a vehicle, thereby providing an optimum field of vision to a user who intends to view information displayed on the display unit.

In addition, the apparatus for deploying a display unit according to the present disclosure controls the tilting angle of the display unit and the distance between a user and the display unit depending on the state of a seat, thereby improving user convenience.

The above description is illustrative of the present disclosure. Also, the above disclosure is intended to illustrate and explain various embodiments of the present disclosure. The embodiments of the present disclosure may be used in various other combinations, modifications, and environments. In other words, the various embodiments may be changed or modified within the scope of the concept of the disclosure disclosed herein, within the equivalent scope of the disclosure, and/or within the skill and knowledge of one having ordinary skill in the art. The described embodiments illustrate the best state of the art to implement the technical idea of the present disclosure. Various changes may be made thereto as demanded for specific applications and uses of the present disclosure. Accordingly, the above description is not intended to limit the present disclosure to the embodiments. Also, the appended claims should be construed as encompassing such other embodiments.

What is claimed is:

1. An apparatus for deploying a display unit, the apparatus comprising:
 a cowl cross bar disposed inside a crash pad so as to be coupled to a center part of the crash pad;
 a housing disposed on the cowl cross bar;
 a display unit configured to be deployed along the housing; and
 a rotating unit configured to rotate the housing with respect to the cowl cross bar.

2. The apparatus of claim 1, further comprising:
a driving unit coupled to the cowl cross bar in order to cause sliding movement of the cowl cross bar; and
a controller configured to control at least one of an extent of deployment of the display unit, an amount of sliding movement of the cowl cross bar, or an amount of rotation of the housing.

3. The apparatus of claim 2, wherein the driving unit comprises:
a rack gear part engaged with a side bracket fixed to a vehicle body; and
a driving part disposed at the side bracket to apply a driving force to the rack gear part so that the rack gear part moves along a guide part, provided at the side bracket, in a longitudinal direction of the guide part.

4. The apparatus of claim 1, wherein the rotating unit comprises:
a gear part disposed around an outer surface of the cowl cross bar that faces the housing; and
a rotating part disposed at the housing to apply a rotational force to the housing so that the housing is rotated along the gear part.

5. The apparatus of claim 4, further comprising:
a link part disposed at a portion of the cowl cross bar to which the housing is fastened.

6. The apparatus of claim 2, wherein the controller controls an extent of deployment of the display unit depending on a driving mode of a vehicle.

7. The apparatus of claim 2, wherein the controller controls a tilting angle of the display unit depending on a driving mode of a vehicle.

8. The apparatus of claim 2, wherein the controller controls sliding movement of the center part depending on a driving mode of a vehicle.

9. The apparatus of claim 2, wherein, when a seatback is reclined to a predetermined angle or more, the controller performs control such that the housing is rotated.

10. The apparatus of claim 2, wherein, when a seat is rotated in a leftward-rightward direction to an angle greater than a first set angle, the controller performs control such that the display unit is fully deployed from the housing and stands upright.

11. The apparatus of claim 2, wherein, when a seat is rotated in a leftward-rightward direction to an angle less than or equal to a first set angle, the controller performs control such that the display unit is drawn into the housing and the center part is inserted into the crash pad.

12. The apparatus of claim 2, wherein the controller controls a tilting angle of the housing depending on a state of light introduced into a vehicle from an external light source present outside the vehicle.

* * * * *